(12) United States Patent
Gordon et al.

(10) Patent No.: US 7,767,967 B2
(45) Date of Patent: Aug. 3, 2010

(54) CAPTURING MOTION USING QUANTUM NANODOT SENSORS

(75) Inventors: Demian Gordon, Culver City, CA (US); Bruce Dobrin, Altadena, CA (US)

(73) Assignees: Sony Corporation, Tokyo (JP); Sony Pictures Entertainment Inc., Culver City, CA (US)

( * ) Notice: Subject to any disclaimer, the term of this patent is extended or adjusted under 35 U.S.C. 154(b) by 0 days.

(21) Appl. No.: 11/854,455

(22) Filed: Sep. 12, 2007

(65) Prior Publication Data

US 2008/0099682 A1    May 1, 2008

Related U.S. Application Data

(60) Provisional application No. 60/856,200, filed on Nov. 1, 2006.

(51) Int. Cl.
   *G01J 5/02* (2006.01)
(52) U.S. Cl. .................................. 250/339.05
(58) Field of Classification Search ............. 250/339.05
   See application file for complete search history.

(56) References Cited

U.S. PATENT DOCUMENTS

| | | | |
|---|---|---|---|
| 4,764,668 A | 8/1988 | Hayard | |
| 4,905,315 A | 2/1990 | Solari et al. | |
| 5,023,709 A | 6/1991 | Kita et al. | |
| 5,268,734 A | 12/1993 | Parker et al. | |
| 5,485,163 A | 1/1996 | Singer et al. | |
| 5,504,477 A | 4/1996 | Whitright et al. | |
| 5,631,468 A * | 5/1997 | Dellacorna | 250/339.05 |
| 5,900,978 A | 5/1999 | Sagar et al. | |
| 6,061,644 A | 5/2000 | Leis | |
| 6,236,508 B1 * | 5/2001 | Stapelbroek | 359/565 |
| 6,438,508 B2 | 8/2002 | Tamir et al. | |
| 6,567,116 B1 | 5/2003 | Aman et al. | |
| 7,076,092 B2 | 7/2006 | Hollars et al. | |
| 7,109,470 B2 * | 9/2006 | Kohler | 250/226 |
| 2002/0140822 A1 | 10/2002 | Kahn et al. | |
| 2002/0164054 A1 | 11/2002 | McCartney et al. | |
| 2003/0189173 A1 * | 10/2003 | Kohler | 250/341.1 |
| 2005/0114073 A1 | 5/2005 | Gobush | |
| 2005/0151880 A1 | 7/2005 | Sullivan | |
| 2005/0285038 A1 * | 12/2005 | Frangioni | 250/330 |
| 2006/0110279 A1 | 5/2006 | Han et al. | |
| 2006/0208193 A1 | 9/2006 | Bodkin | |

OTHER PUBLICATIONS

Ilya Fushman, DirkEnglund, and Jelena Vuckovic, "Coupling of PbS quantum dots to photonic crystal cavities at room temperature." Applied Physics Letters, vol. 87, Article 241102 (2005).*
International Search Report and Written Opinion issued in PCT/US07/83361 on Mar. 28, 2008.
Office Action issued in U.S. Appl. No. 11/776,358 on Sep. 19, 2008.

* cited by examiner

*Primary Examiner*—Constantine Hannaher
(74) *Attorney, Agent, or Firm*—Procopio, Cory, Hargreaves & Savitch LLP

(57) ABSTRACT

A quantum nanodot camera, including: a quantum nanodot camera sensor including: at least one visible pixel sensor configured to capture scenes including actors and/or objects in a visible band; and at least one IR pixel sensor configured to capture motions of at least one quantum nanodot (QD) marker tuned to emit a narrowband IR signal.

13 Claims, 15 Drawing Sheets

| G₁₁ | R₁₁ | G₁₂ | R₁₂ | G₁₃ | R₁₃ |
|---|---|---|---|---|---|
| B₁₁ | I | B₁₂ | I | B₁₃ | I |
| G₂₁ | R₂₁ | G₂₂ | R₂₂ | G₂₃ | R₂₃ |
| B₂₁ | I | B₂₂ | I | B₂₃ | I |
| G₃₁ | R₃₁ | G₃₂ | R₃₂ | G₃₃ | R₃₃ |
| B₃₁ | I | B₃₂ | I | B₃₃ | I |

FIG. 12

CAPTURING MOTION USING QUANTUM NANODOT SENSORS

CROSS-REFERENCE TO RELATED APPLICATIONS

This application claims the benefit of priority of co-pending U.S. Provisional Patent Application No. 60/856,200, filed Nov. 1, 2006, entitled "Imagedots Camera." The disclosure of the above-referenced patent application is hereby incorporated by reference. This application further incorporates by reference the disclosures of commonly assigned U.S. patent application Ser. No. 11/776,358, filed Jul. 11, 2007, entitled "Using Quantum Nanodots in Motion Pictures or Video Games."

BACKGROUND

1. Field of the Invention

The present invention relates generally to quantum nanodot cameras, and more particularly to using such quantum nanodot cameras in motion pictures or video games.

2. Description of the Prior Art

Motion capture systems are used to capture the movement of a real object and map it onto a computer generated object. Such systems are often used in the production of motion pictures and video games for creating a digital representation of a person for use as source data to create a computer graphics ("CG") animation. In a typical system, an actor wears a suit having markers attached at various locations (e.g., having small reflective markers attached to the body and limbs) and digital cameras record the movement of the actor from different angles while illuminating the markers. The system then analyzes the images to determine the locations (e.g., as spatial coordinates) and orientation of the markers on the actor's suit in each frame. By tracking the locations of the markers, the system creates a spatial representation of the markers over time and builds a digital representation of the actor in motion. The motion is then applied to a digital model, which may then be textured and rendered to produce a complete CG representation of the actor and/or performance. This technique has been used by special effects companies to produce realistic animations in many popular movies.

Tracking the locations of markers, however, is a difficult task. The difficulties compound when a large number of markers is used and multiple actors populate a capture volume.

Quantum nanodot markers have been used to measure golf ball flight characteristics and club head swing characteristics. For example, U.S. Patent Publication No. 2005/0114073 discloses a monitor system that measures flight characteristics of at least one object moving in a predetermined field-of-view using fluorescent properties of markers including quantum nanodots. This system uses fluorescent properties exhibited by quantum nanodots that when radiated by light of a certain wavelength the quantum nanodots immediately re-radiate at broad spectrum of wavelengths causing the quantum nanodots to brightly fluoresce. These properties allow the monitor system to track the trajectory of a very brightly radiating golf ball.

SUMMARY

Embodiments of the present invention include using quantum nanodot cameras in motion pictures or video games.

In one aspect, a quantum nanodot camera is disclosed. The quantum nanodot camera comprises: a quantum nanodot camera sensor including: at least one visible pixel sensor configured to capture scenes including actors and/or objects in a visible band; and at least one IR pixel sensor configured to capture motions of at least one quantum nanodot (QD) marker tuned to emit a narrowband IR signal.

In another aspect, the quantum nanodot camera, comprises: a light splitting apparatus to split incoming light into visible and IR components; a single unit camera sensor including: a visible sensor portion configured to capture scenes including actors and/or objects in a visible band; and an IR sensor portion configured to capture motions of at least one quantum nanodot (QD) marker tuned to emit a narrowband IR signal, wherein the visible component is directed to said visible sensor and the IR component is directed to said IR sensor.

Other features and advantages of the present invention will become more readily apparent to those of ordinary skill in the art after reviewing the following detailed description and accompanying drawings.

BRIEF DESCRIPTION OF THE DRAWINGS

The details of the present invention, both as to its structure and operation, may be gleaned in part by study of the accompanying drawings, in which:

FIG. 12 shows the array of color filters for the quantum nanodot camera sensor;

DETAILED DESCRIPTION

Figure 1:
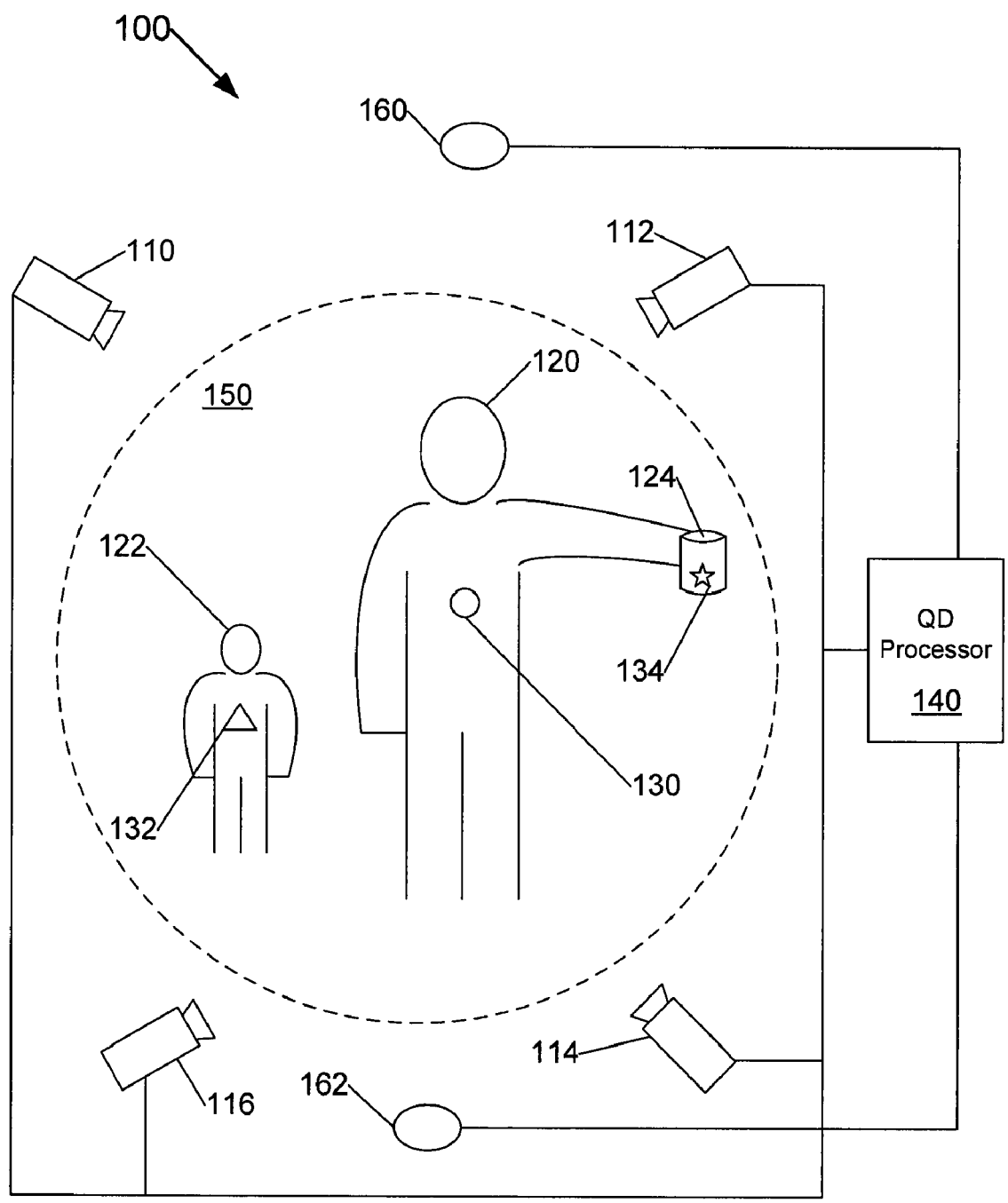
FIG. 1 illustrates a QD processing system using quantum nanodots in accordance with one implementation.

Certain implementations as disclosed herein provide for systems and methods to implement a technique for using quantum nanodots (sometimes referred to as quantum dots or "QDs") as markers (i.e., QD markers) and for using quantum nanodot cameras in motion pictures or video games.

Quantum nanodots are nano-crystalline structures that can be tuned to emit light of one of a variety of wavelengths that is longer than the wavelength of light used to excite the QDs. Thus, a number of capture objects each equipped with markers made of uniquely tuned QDs can be excited together under a single light.

For example, one method as disclosed herein utilizes a quantum nanodot ("QD") processing system to capture the motion and surfaces of multiple actors and/or objects using: (1) marker capture cameras tuned to a narrow IR band, and configured to capture quantum nanodots attached to actors and/or objects; and (3) at least one image capture camera tuned to the visible band, which records scenes as would be seen by a human audience. The QD processing system builds motion and/or other hidden data from the captured IR images as well as images or scenes recorded in the visible band. The QD processing system integrates the motion/hidden data with the recorded visible scenes.

Further implementations include providing functions of the image capture cameras and the marker capture cameras in a single unit quantum nanodot camera, which can be configured to perform motion capture, video tracking, camera tracking, match moving, compositing, image stabilization, interpolated rotoscoping, and other related special effects functions.

Features provided in implementations include, but are not limited to, configuring and processing the quantum nanodots and cameras to produce integrated scenes/images for motion pictures or video games.

After reading this description it will become apparent to one skilled in the art how to practice the invention in various alternative implementations and alternative applications. However, although various implementations of the present invention will be described herein, it is understood that these embodiments are presented by way of example only, and not limitation. As such, this detailed description of various alternative implementations should not be construed to limit the scope or breadth of the present invention as set forth in the appended claims.

As mentioned above, quantum nanodots are nano-crystalline structures that can be tuned to emit light of a wavelength that is longer than the wavelength of light used to excite the QD markers. Thus, when a photon or an electron excites the QD, the QD is quantum shifted to a higher energy state. On returning to the ground state, the QD emits a photon of a specific frequency. The QD can be tuned by varying the structure and size of the nano-crystal to any wavelength that is longer than the wavelength of the exciting photon. For example, in one implementation, the QDs are tuned so that when they are illuminated or excited with light of a visible wavelength (approximately 700 nm for red to 400 nm for violet), the light is quantum shifted by the QDs to emit narrowband (~5 to 10 nm width) of IR (~750 nm to 1000 μm) or near-IR (~750 nm to 1400 nm) signal.

By tuning the QDs as described above, the QDs can be used as markers in a QD processing system. In one implementation, the IR cameras are configured to capture the motion and surfaces of multiple actors and/or objects using QD markers attached to the actors/objects. In another implementation, the IR cameras are configured so that each IR camera detects different QD marker(s) tuned to a specific IR frequency. This implementation allows the IR cameras to discriminate between actors/objects within a capture volume. For example, three QD markers tuned to emit IR signals are attached to three different actors, and three IR marker capture cameras, each configured to capture only one QD marker, are used to discriminate between three actors.

FIG. 1 illustrates a QD processing system 100 using quantum nanodots in accordance with one implementation. In the illustrated implementation, the QD processing system 100 includes a capture volume 150 surrounded by an image capture camera 110 (sometimes referred to as "film" camera), a plurality of marker capture cameras 112, 114, 116 (sometimes referred to as "witness" cameras), a plurality of illumination sources (e.g., lights) 160, 162, and a QD processor 140.

The image capture camera 110 can be configured as any camera tuned to a visible wavelength range. Thus, the image capture camera 110 can be a camera configured to capture and record scenes in the visible band onto a film. However, the image capture camera 110 can also be a camera configured to digitally capture and record scenes in the visible band onto a digital recording media.

Figure 2A:
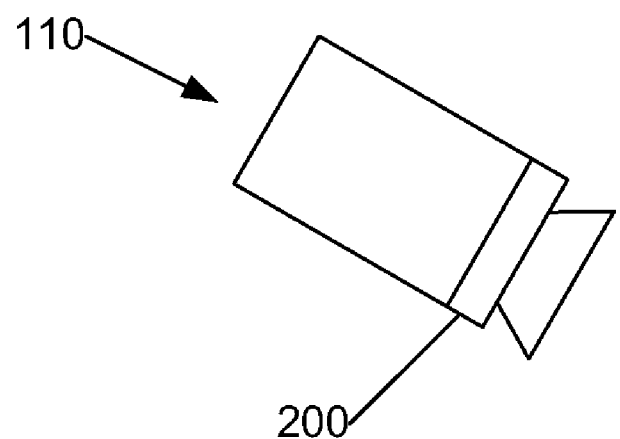
FIGS. 2A and 2B show an image capture camera and a filter tuned to receive light in the visible wavelength range.
Figure 2B:
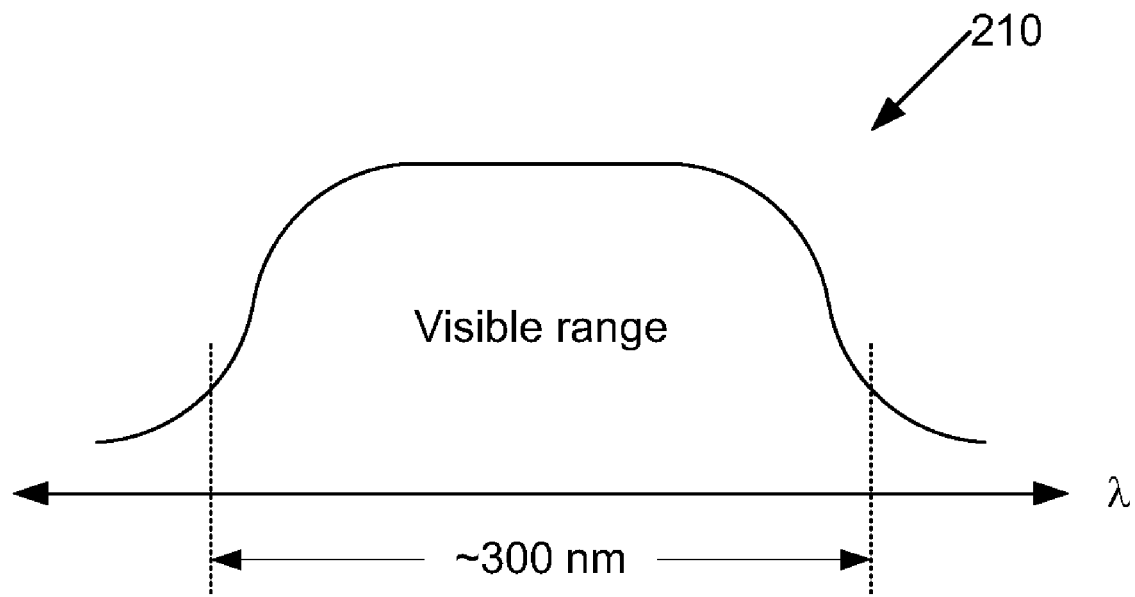

In one implementation shown in FIG. 2A, the image capture camera 110 includes a filter 200 which is tuned to receive light in the visible wavelength range 210 (see FIG. 2B). Thus, the filter 200 is tuned to receive light of approximately 300 nm in width in the visible band but to reject signals in other bands such as in the IR band. This configuration of the image capture camera 110 keeps the QD markers virtually invisible to the image capture camera 110 so that the actors and/or objects can be marked with "hidden" markers. In other implementations, multiple image capture cameras are used.

The marker capture cameras 112, 114, 116, in one implementation, are configured as IR or near-IR cameras to capture motions of capture objects 120, 122, 124. Typically, the capture objects are actors 120, 122 with QD markers 130, 132 attached at various locations on the actors' body. However, the capture objects can be non-animate objects, such as props and/or animals (e.g., a can of soda 124 with QD marker 134). In a particular implementation, the IR cameras 112, 114, 116 are configured to label or mark actors and/or objects in a scene so that the actors and/or objects can be later replaced, deleted, or inserted. For example, a can of soda 124 is labeled with QD marker 134 in a scene of a movie so that the label on the can of soda can be inserted even after the movie is finished. This can be done when an advertising sponsor for the soda is expected to be found after the production of the movie is finished.

In another implementation, the marker capture cameras are configured as machine vision cameras optimized for QD emissions. For example, machine vision cameras are used to discriminate parts on a conveyor belt. Thus, the parts are coated with tuned QD material so that the QD processing system can appropriately separate the parts for further processing.

In some implementations, the image capture camera 110 and the marker capture cameras 112, 114, 116 can be configured as a single camera unit providing a dual capability of capturing visible band images and narrowband IR signals.

Figure 3A:
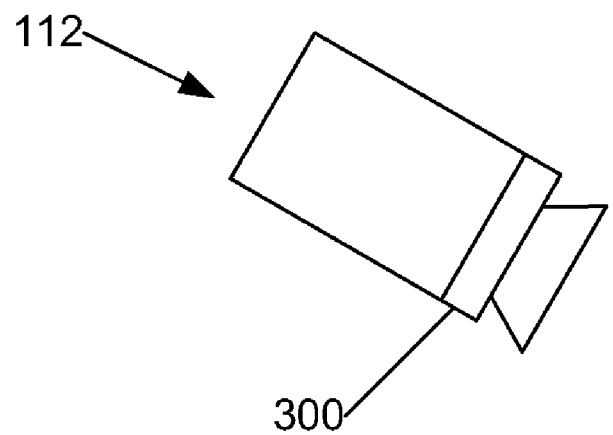
FIGS. 3A and 3B show a marker capture camera and a filter tuned to receive signals in an IR wavelength range.
Figure 3B:
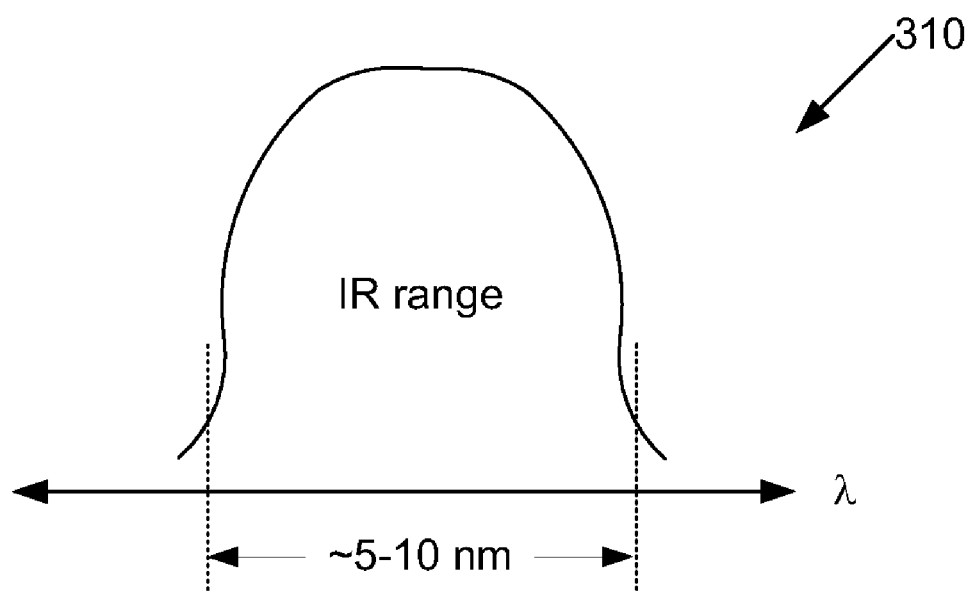

FIG. 3A illustrates the marker capture camera 112 with a filter 300 tuned to receive signals in an IR wavelength range 310 (see FIG. 3B). Thus, the filter 300 is tuned to receive signals of approximately 5 to 10 nm in width in the IR band but reject signals in other bands such as in the visible band and other IR bands. By rejecting light in the visible band (i.e., the illumination source and other reflected light sources), the IR camera 112 can easily detect particular QD marker(s) tuned to be received by the IR camera 112. Other marker capture cameras 114, 116 can be configured similarly to the marker capture camera 112. These configurations of the marker capture cameras 112, 114, 116 allow the QD processor 140 to capture and track motions of several actors/objects simultaneously and accurately using QD markers as markers.

In one implementation, the narrowband filter 300 (tuned to the frequency of one of the QD emissions) of the IR camera 112 is positioned between the focal plane and the lens. In another implementation, the filter 300 is positioned in front of the lens.

Figure 4A:
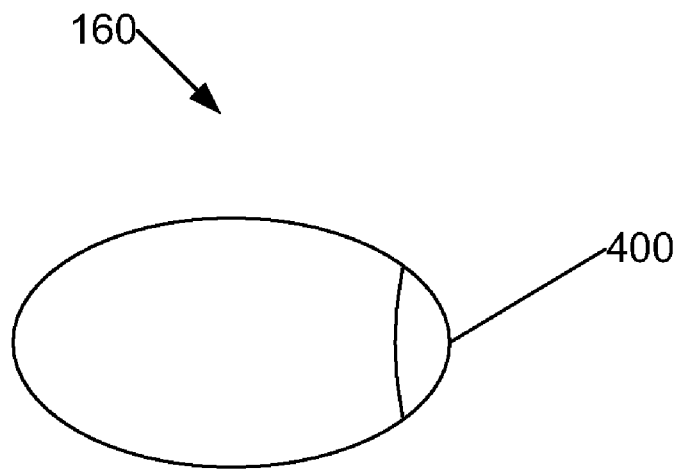
FIGS. 4A and 4B show an illumination source configured to excite QD markers in a capture volume and a filter tuned to excite QD markers with light in the visible wavelength range.
Figure 4B:
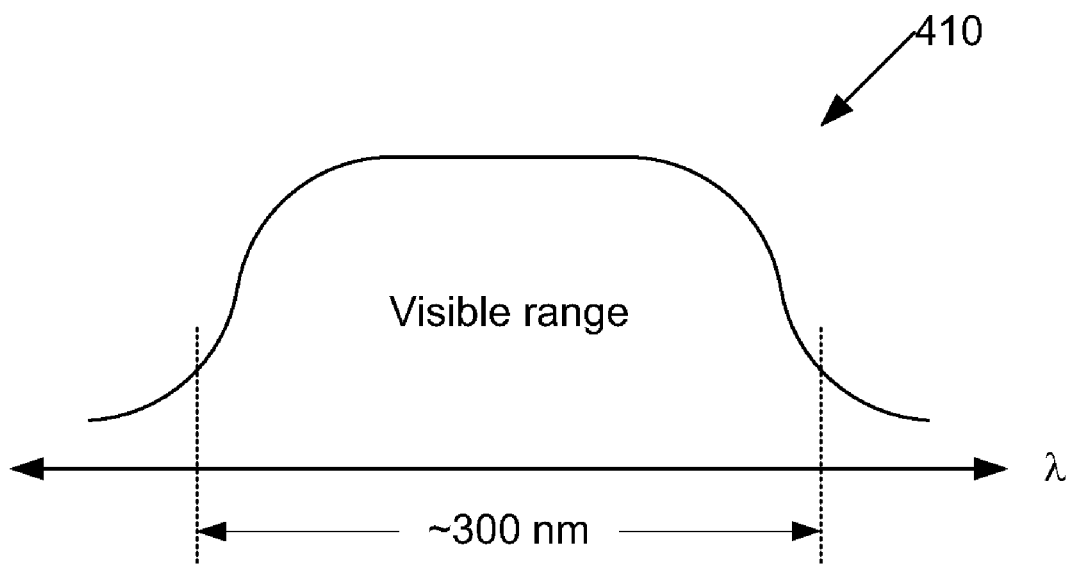

FIG. 4A shows an illumination source 160 configured to excite QD markers 130, 132, 134 in the capture volume 150 in accordance with one implementation. The illumination source 160 includes a filter 400 so that the QD markers are excited with tuned light in the visible wavelength range 410 (see FIG. 4B). Thus, the filter 400 is tuned to radiate light of approximately 300 nm in width in the visible band but reject signals in other bands such as in the IR band. The illumination source 162 can be configured similarly to the illumination source 160.

In some implementations, the room lights are also filtered to remove frequencies that would fall in the emission frequency range. Since this range is expected to be in the invisible to lower red range of the spectrum, the room filtering should be unnoticed by personnel or equipment in the room.

Motion capture systems using retro-reflective materials often require a large array of high resolution cameras running at high frame rates to track the materials placed on the actors/objects. Interference from the illumination source and improper reflections require strong general filters, electronic cancellation of known interference sources, and a reduction in the effectiveness of the system. Accordingly, relatively expensive ring lights are often used as illumination sources in a typical motion capture system.

By contrast, inexpensive lights or even ambient light can be used as illumination sources in a QD processing system. This is because the QD markers can be tuned to absorb small quantity of excitation light and quantum shift the light to emit IR signals which can be easily detected by an IR camera. Since the IR camera (finely tuned to a narrowband IR signal) is not affected by the excitation light (i.e., the illumination source usually tuned to the visible band), the QD markers can be easily detected even when they do not reflect bright visible light.

In another implementation, QD markers can be configured as quantum nanodot LEDs ("QD LEDs") or quantum nanodot electroluminescent ("EL") devices that are tunable to a specific IR frequency. Electrical current would be driven through the QD markers but QD markers would be operable even without any illumination sources (i.e., self illuminating). Thus, the QD markers will emit IR signals even when they are occluded from the illumination sources by actors/objects in the capture volume. In other implementations, other self illuminating excitation sources, such as UV lamps, are used.

In one implementation, the QD markers are suspended in water-based ink or paint which is then applied to an actor and/or object. In another implementation, the QD markers are added to any medium, such as ink, paint, plastic, clothing, temporary tattoo material, or other similar material. In another implementation, the QD markers in the ink or paint could be applied to or included in the markers that are shaped as spherical or flat disc, or applied directly to the skin of an actor. In yet another implementation, the QD markers are configured such that each QD marker forms a unique pattern. Thus, each uniquely patterned QD marker is applied to each actor/object to further discriminate objects within a capture volume. For example, in FIG. 1, QD marker 130 (a circular pattern) is applied to the actor 120, QD marker 132 (a triangular pattern) is applied to the actor 122, and QD marker 134 (a star pattern) is applied to the object 124. In a further implementation, several QD markers are configured to form a unique pattern as a group. In practice, a pattern of each QD marker is configured as different forms of a checker board design.

Figure 5:
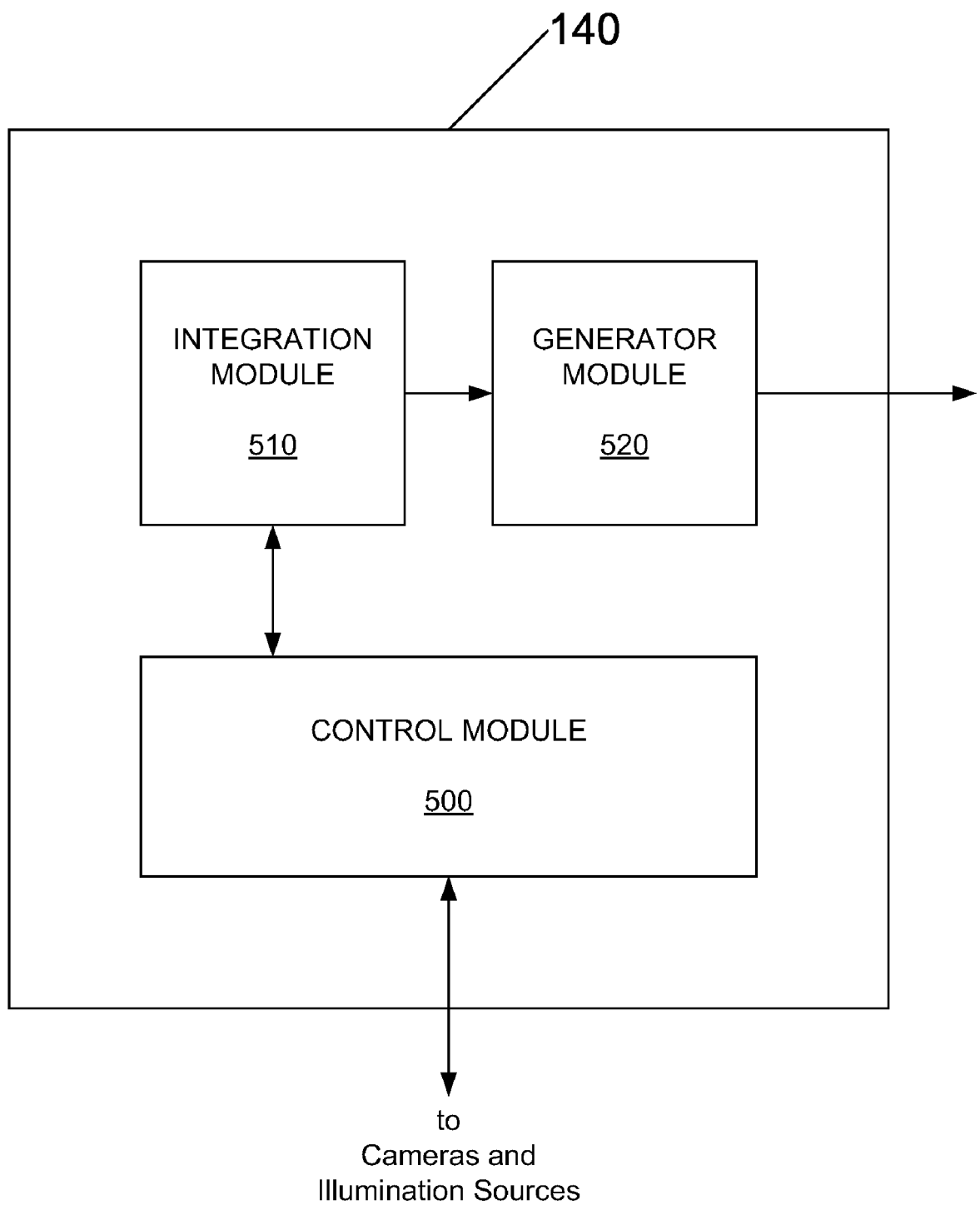
FIG. 5 is a detailed block diagram of a QD processor in accordance with one implementation.

FIG. 5 is a detailed block diagram of the QD processor 140 in accordance with one implementation. As shown, the QD processor 140 includes a control module 500, an integration module 510, and a generator module 520. The control module 500 triggers the cameras 110, 112, 114, 116 to open their shutters and/or perform capture, and the illumination sources 160, 162 to illuminate the capture volume 150 at a predetermined timing, which is usually a multiple of 24 frames per second (fps). The QD markers emit signals at the tuned frequencies. Each camera registers the position of QD marker(s) that is/are tuned for that specific camera. The control module 500 also commands the integration module 510 to collate, reconcile, and integrate the information received from each camera.

The integration module 510 integrates the scenes captured from the image capture camera 110 with the motions of the QD markers captured in narrowband IR signals by the marker capture cameras 112, 114, 116. The generator module 520 receives the integrated scenes from the integration module 510 and generates scenes marked with hidden marks. The scenes marked with hidden marks can be processed so that the actors and/or objects are later replaced, deleted, or inserted from the scenes.

In one implementation, the generated scenes marked with hidden marks form motion picture. In another implementation, the generated scenes marked with hidden marks form a video game. In another implementation, the generated scenes marked with hidden marks form a series of frames for a machine vision processing.

Figure 6:
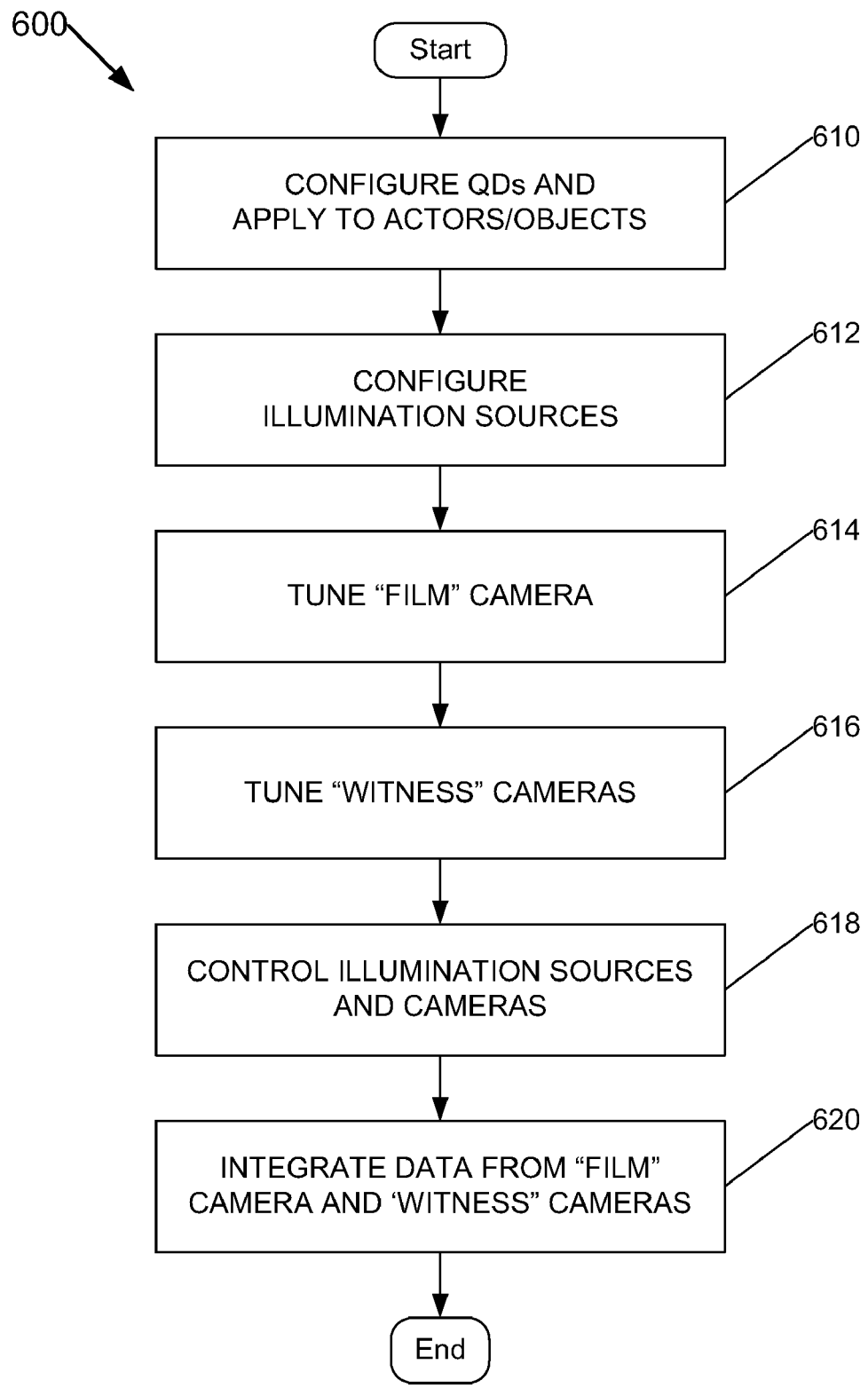
FIG. 6 is a flowchart illustrating a method of processing quantum nanodots used as markers.

FIG. 6 is a flowchart illustrating a method 600 of processing quantum nanodots used as markers. At block 610, the QD markers are configured and applied to actors and/or objects. In one implementation, as discussed above, the QD markers are tuned to emit IR signals of a narrow band to be captured by marker capture cameras. Once the QD markers are tuned, they are mixed with ink, paint, or other similar material to be applied to actors and/or objects. The illumination sources are configured, at block 612, to excite the QD markers tuned to emit narrowband IR. As discussed above, in one implementation, the illumination sources can be configured as visible or ambient light. In another implementation, the QD markers can be configured as self-illuminating with electroluminescent QD markers.

At block 614, the image capture camera is configured to capture scenes in a visible wavelength band. This allows the scenes to include hidden marks while the image capture camera captures scenes of a movie or video game. The marker capture cameras are then configured, at block 616, to capture or mark actors and/or objects within a capture volume. In one implementation discussed above, the marker capture cameras are configured as IR cameras, where each IR camera is tuned to a specific narrowband IR to detect a correspondingly-tuned QD marker.

At block 618, illumination sources and cameras are controlled to capture signals from the capture volume. For example, the cameras are triggered to open their shutters and/or perform capture, and the illumination sources are commanded to illuminate the capture volume at a predetermined timing. The QD markers emit signals at the tuned frequencies. Each camera registers the position of QD marker(s) that is/are tuned for that specific camera. Information from each camera is then collated, reconciled, and integrated, at block 620.

Figure 7A:
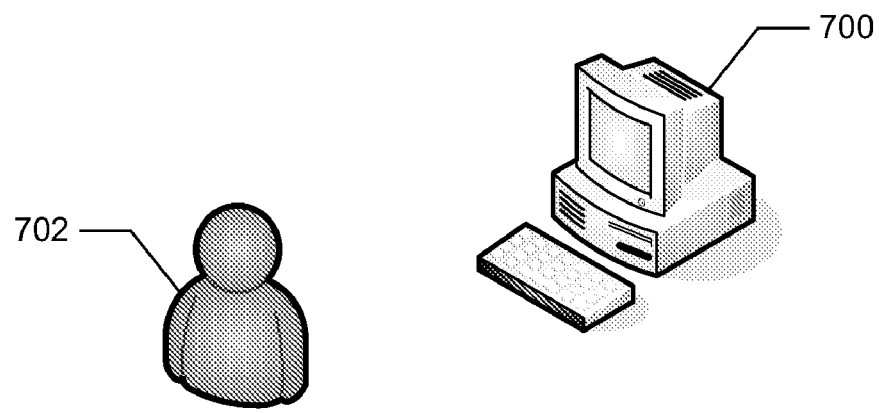
FIG. 7A illustrates a representation of a computer system and a user.

FIG. 7A illustrates a representation of a computer system 700 and a user 702. The user 702 can use the computer system 700 to process and manage quantum nanodots used as markers. The computer system 700 stores and executes a QD processing system 712, which processes QD data captured by cameras.

Figure 7B:
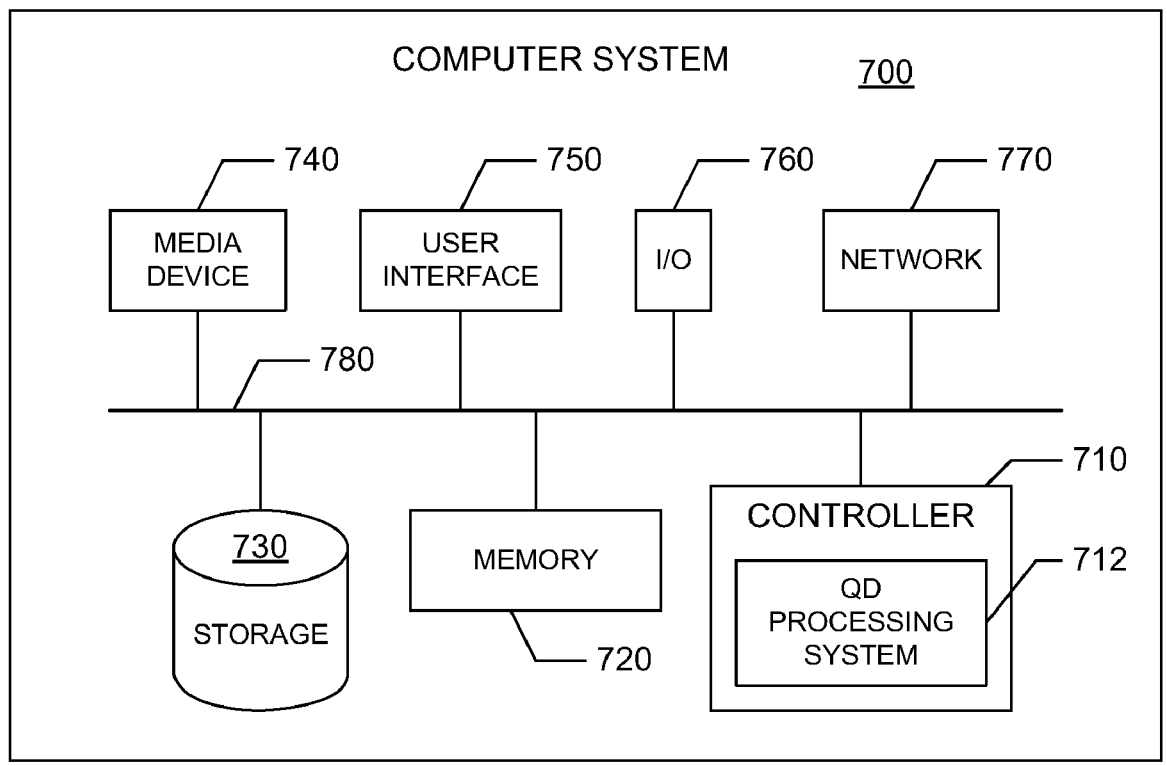
FIG. 7B is a functional block diagram illustrating the computer system hosting the QD processing system.

FIG. 7B is a functional block diagram illustrating the computer system 700 hosting the QD processing system 712. The controller 710 is a programmable processor which controls the operation of the computer system 700 and its components. The controller 710 loads instructions from the memory 720 or an embedded controller memory (not shown) and executes these instructions to control the system. In its execution, the controller 710 provides the QD processing system 712 as a software system. Alternatively, this service can be implemented as separate components in the controller 710 or the computer system 700.

Memory 720 stores data temporarily for use by the other components of the computer system 700. In one implementation, memory 720 is implemented as RAM. In another implementation, memory 720 also includes long-term or permanent memory, such as flash memory and/or ROM.

Storage 730 stores data temporarily or long term for use by other components of the computer system 700, such as for storing data used by the QD processing system 712. In one implementation, storage 730 is a hard disk drive.

The media device 740 receives removable media and reads and/or writes data to the inserted media. In one implementation, the media device 740 is an optical disc drive.

The user interface 750 includes components for accepting user input from the user of the computer system 700 and presenting information to the user. In one implementation, the user interface 750 includes a keyboard, a mouse, audio speakers, and a display. The controller 710 uses input from the user to adjust the operation of the computer system 700.

The I/O interface 760 includes one or more I/O ports to connect to corresponding I/O devices, such as external storage or supplemental devices (e.g., a printer or a PDA). In one implementation, the ports of the I/O interface 760 include ports such as: USB ports, PCMCIA ports, serial ports, and/or parallel ports. In another implementation, the I/O interface 760 includes a wireless interface for communication with external devices wirelessly.

The network interface 770 includes a wired and/or wireless network connection, such as an RJ-45 or "Wi-Fi" interface (including, but not limited to 802.11) supporting an Ethernet connection.

The computer system 700 includes additional hardware and software typical of computer systems (e.g., power, cooling, operating system), though these components are not specifically shown in FIG. 7B for simplicity. In other implementations, different configurations of the computer system can be used (e.g., different bus or storage configurations or a multi-processor configuration).

Figure 8A:
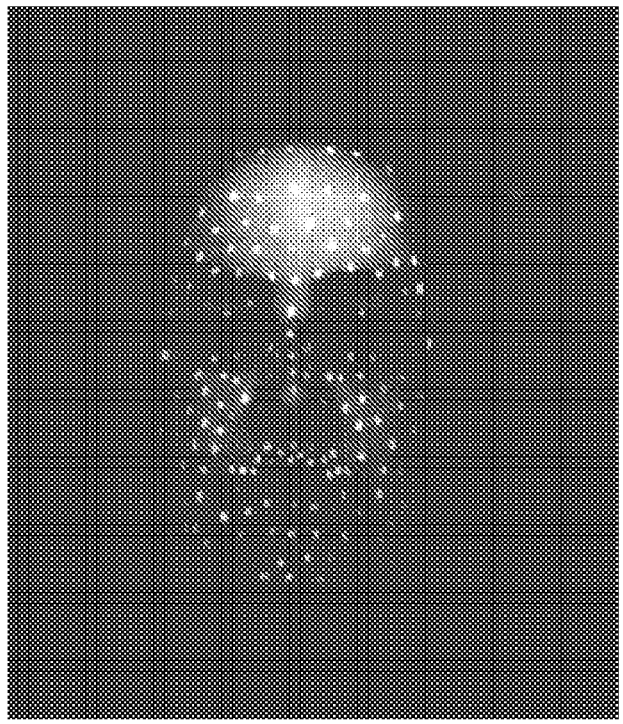
FIGS. 8A and 8B show example frames captured using QD markers tuned to 855 nm with an IR marker capture camera having a narrow bandpass filter (centered at 852 nm) in front of the lens.
Figure 8B:
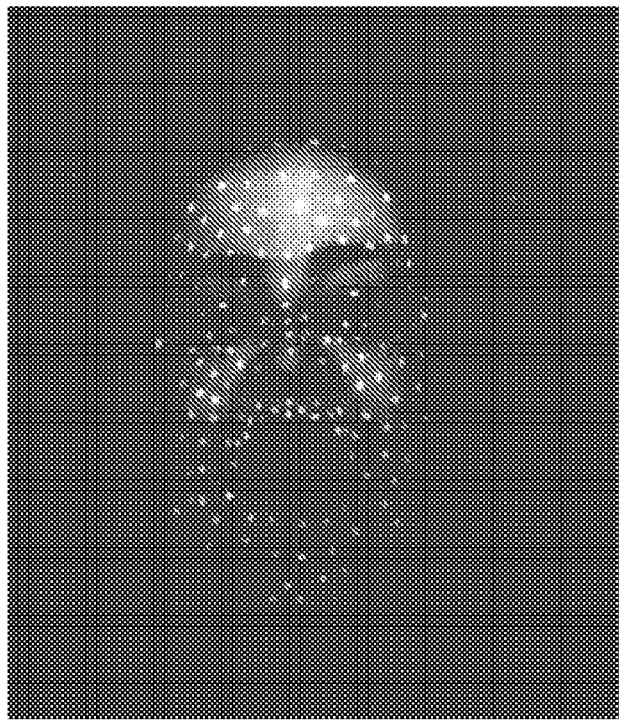
Figure 9A:
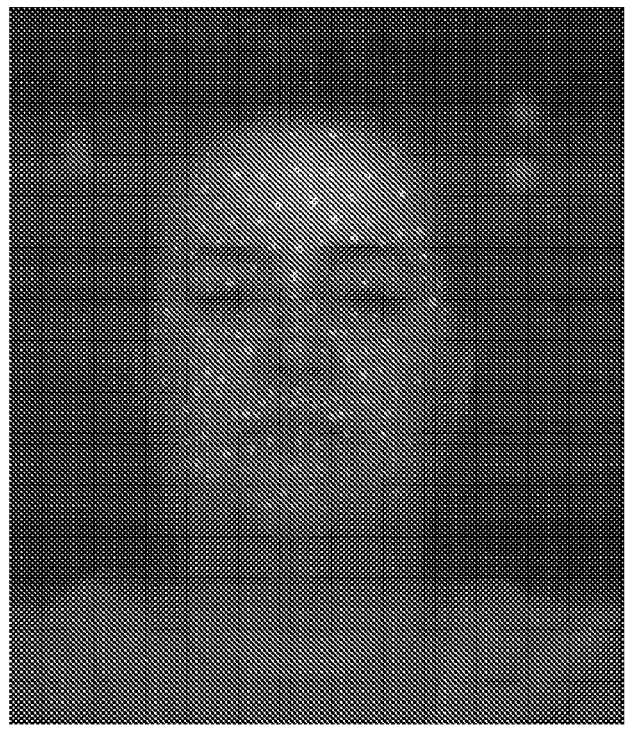
FIGS. 9A and 9B show the same frames captured without the narrow bandpass filter in front of the lens.
Figure 9B:
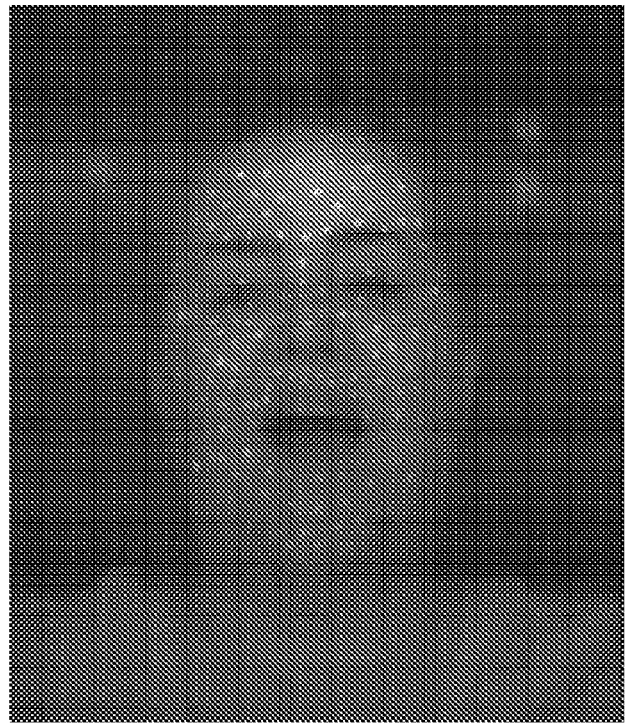

FIGS. 8A and 8B show example frames captured using QD markers tuned to 855 nm at 65 frames/second. The frames were captured with an IR marker capture camera having a narrow bandpass filter (centered at 852 nm) in front of the lens. FIGS. 9A and 9B show the same frames captured with wider filter than those of FIGS. 8A and 8B.

Additional variations and implementations are also possible. For example, the integrated data from image capture and marker capture cameras can be used in applications other than movies or video games, such as advertising, online or offline computer content (e.g., web advertising or computer help systems), any other animated computer graphics video applications, or other applications including machine vision applications. In another example, the QD markers can be tuned to emit signals other than IR signals such as signals in UV, microwave, or any other frequency range.

Referring back to FIG. 1, although the illustrated implementation of the QD processing system 100 shows image capture camera 110 (for capturing images or scenes in the visible band) and marker capture camera 112, 114, or 116 (for capturing quantum nanodot markers in a narrow IR band) as separate units, there are many advantages to having functions of the image capture camera 110 and the marker capture camera 112, 114, or 116 in a single unit (hereinafter referred to as "quantum nanodot camera"). In applications such as motion capture, video tracking, camera tracking, match moving, compositing, image stabilization, interpolated rotoscoping, and other related special effects techniques, using a single unit quantum nanodot camera substantially reduces the need to process position, angle, perspective, and other related information to resolve spatial corrections for images and motions from multiple cameras.

For example, match moving is a special effects technology that allows the insertion of virtual objects into real footage with the correct position, scale, orientation and motion in relation to the photographed objects in the scene. This technology often refers to different ways of extracting motion information from a motion picture, particularly camera movement. Thus, match moving is primarily used to track the movement of a camera through a shot so that a virtual camera move can be reproduced inside of a computer. The intent is that when the virtual and real scenes are composited together they will come from the same perspective and appear seamless. Therefore, a single unit quantum nanodot camera would substantially simplify the match moving process.

In another example, compositing in visual effects post-production creates new images or moving images by combining images from different sources, such as real-world digital video, film, synthetic 3-D imagery, 2-D animations, painted backdrops, digital still photographs, and text. Product placement may also involve post-production compositing. Accordingly, compositing using a single unit quantum nanodot camera would substantially simplify the process.

In one implementation, a quantum nanodot camera includes a sensor, a processor, and other elements providing support functions. The sensor includes a plurality of pixel sensors formed by depositing dopant chemicals on the surface of a semiconductor substrate (e.g., silicon). Once formed, each pixel sensor collects photons falling on it, and is identical in design and operation.

Figure 10:
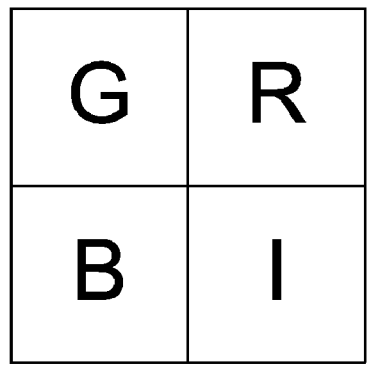
FIG. 10 shows a single 2×2 array of pixel sensors for a quantum nanodot camera sensor in accordance with one implementation.

In FIG. 10, a single 2×2 array of pixel sensors for the quantum nanodot camera sensor is illustrated in accordance with one implementation of the present invention. In the illustrated implementation, the single 2×2 array is configured with four different color filters disposed on top of a corresponding 2×2 array of pixel sensors. The four different color filters include Green (G), Red (R), Blue (B), and Infra-red (I) filters. Thus, by having color filters on top of the pixel sensors, the number of photons falling into each pixel sensor (i.e., the intensity of each color) varies depending on the color of the scene being sensed.

In the example scene of FIG. 1, the visible scene including the actors 120, 122 and the object 124 is only detected by the pixel sensors having the G, R, and B filters, whereas quantum nanodot markers 130, 132, 134 are only detected by the pixel sensor having the I filter.

In one implementation, each pixel sensor is configured as a charge-coupled device (CCD) sensor, where the pixel measurements are processed sequentially by circuitry surrounding the sensor. In another implementation, each pixel sensor is configured as a complementary metal-oxide-semiconductor (CMOS) sensor such as an active pixel sensor (APS), where the pixel measurements are processed simultaneously by a circuitry within the sensor pixels and on the sensor itself.

Figure 11:
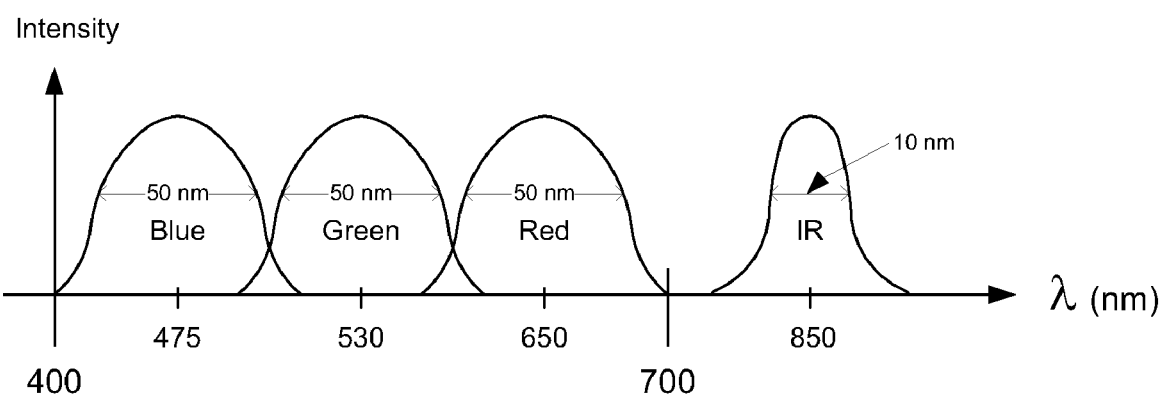
FIG. 11 shows a design of the 2×2 array of color filters for the quantum nanodot camera sensor according to one implementation.

FIG. 11 shows a design of the 2×2 array of color filters for the quantum nanodot camera sensor according to one implementation. As shown, the wavelength of the color filters Blue, Green, and Red are centered at 475 nm, 530 nm, and 650 nm, respectively, with the bandwidth of about 50 nm. The narrowband IR filter is centered at 850 nm with the bandwidth of approximately 10 nm.

The 2×2 array of color filters for the quantum nanodot camera sensor can be extended as shown in FIG. 12. A typical quantum nanodot camera sensor may extend the array into 2000 by 2000 array of pixels. However, the actual resolution of the sensor is reduced by a factor of 4 since four pixels are used to resolve a smallest point in a color scene. Accordingly, each pixel measures only one primary color, while the other colors are "estimated" (e.g., using interpolation) based on the surrounding pixels.

For example, in one implementation, at green pixel $G_{22}$: the blue component is calculated by averaging the adjacent blue pixels, $B_{12}$ and $B_{22}$; and the red component is calculated by averaging the adjacent red pixels, $R_{21}$ and $R_{22}$. At blue pixel $B_{23}$: the green component is calculated by averaging the adjacent green pixels, $G_{23}$ and $G_{33}$; and the red component is calculated by averaging either the adjacent red pixels, $R_{22}$ and $R_{33}$, or the adjacent red pixels, $R_{23}$ and $R_{32}$. At red pixel $R_{31}$: the green component is calculated by averaging the adjacent green pixels, $G_{31}$ and $G_{32}$; and the blue component is calculated by averaging either the adjacent blue pixels, $B_{21}$ and $R_{32}$, or the adjacent blue pixels, $B_{22}$ and $B_{31}$. The Infra-red pixels are not interpolated. In other implementations, the pixels are "estimated" using other known estimation methods.

Figure 13A:
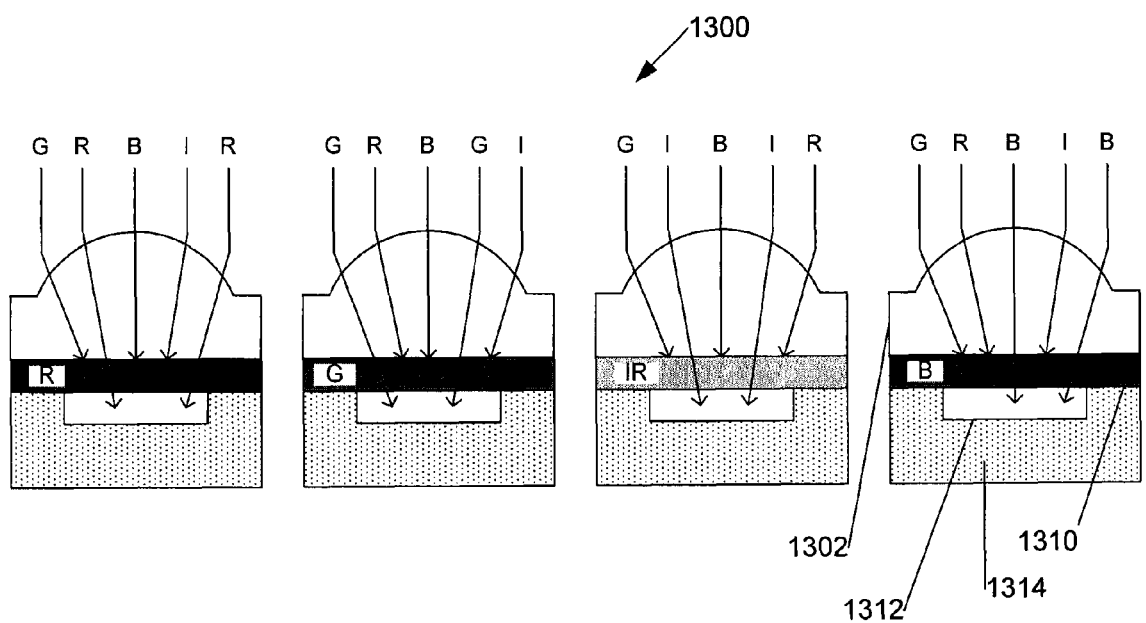
FIGS. 13A and 13B illustrate one implementation of the quantum nanodot camera sensor having four different color filters for pixel sensors.

FIG. 13A illustrates one implementation of the quantum nanodot camera sensor having four different color filters for pixel sensors. As shown in FIG. 13A, each pixel sensor 1300 includes a microlens 1302 configured to direct the incident wave or photon of light onto the color filter 1310. The microlens 1302 directs light to the photo-sensitive portion of the pixel sensor 1300. The photosensitive portion includes the color filter 1310 and a photo sensor 1312. As described above, the photo sensor 1312 is implanted onto a substrate 1314 such as silicon.

In the illustrated example of FIG. 13A, the B filter 1310 passes the blue component of the light while preventing other components from entering the photo sensor 1312. In one implementation, the photo sensor 1312 is configured with a photodiode. Similar to an array of buckets collecting rain water, the photo sensor 1312 collects the blue component of photons of light. Thus, the number of photons collected in the pixel is converted into an electrical charge by the photo sensor 1312. This charge is then converted into a voltage, amplified, and converted to a digital value using an analog to digital (A/D) converter.

Figure 13B:
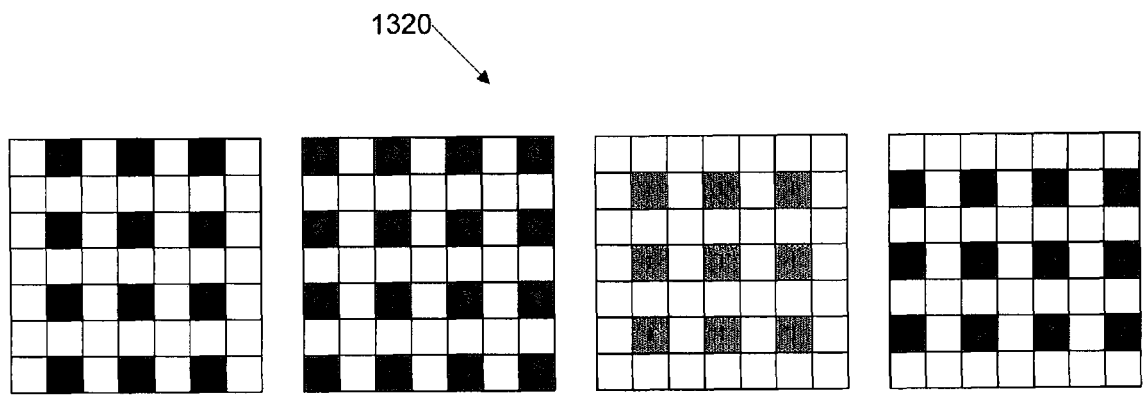

FIG. 13B illustrates color filter array layouts for the four colors including the B color filter array layout 1320.

Figure 14:
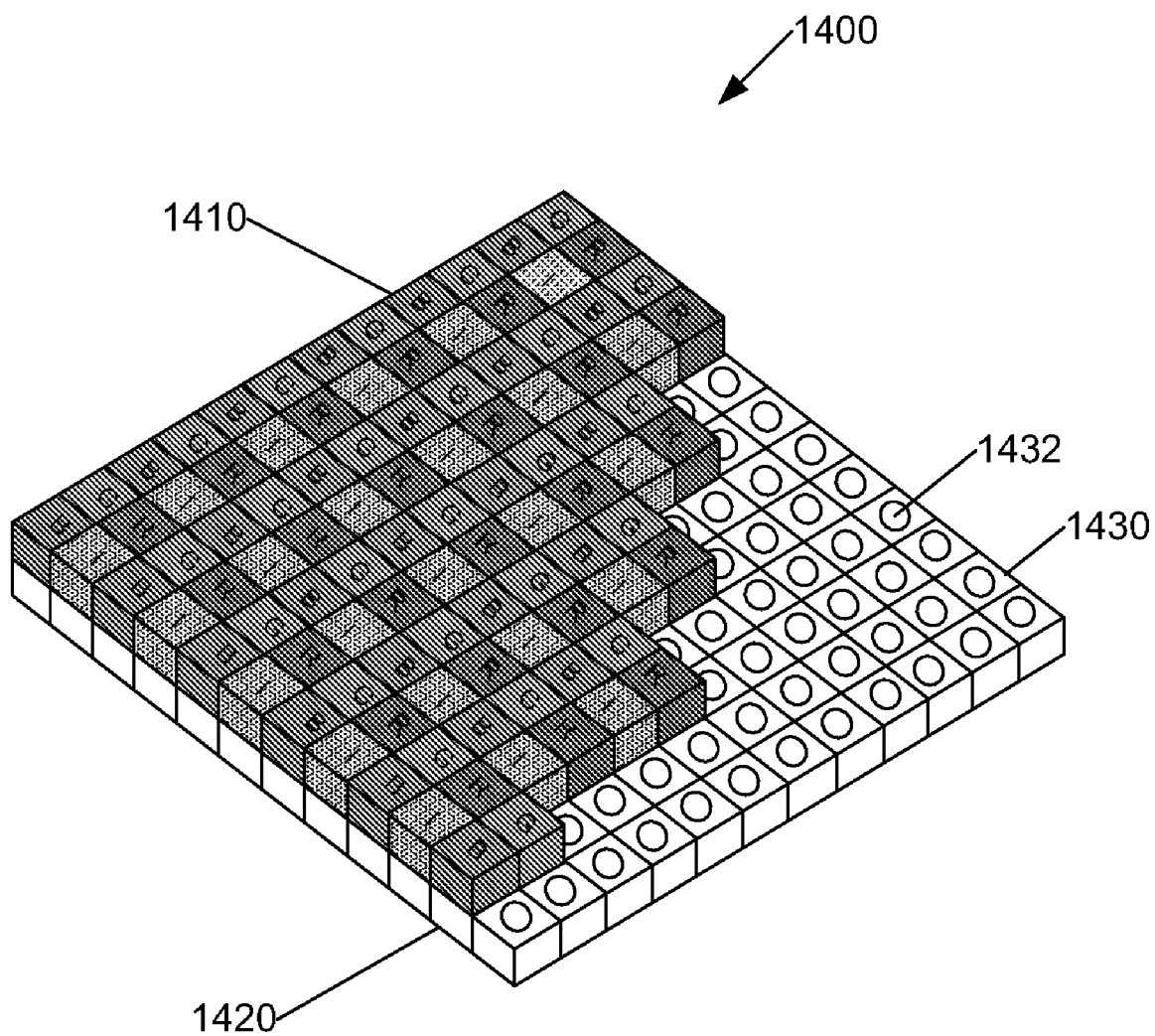
FIG. 14 illustrates a perspective view of the quantum nanodot camera sensor having a color filter array disposed on top of the substrate.

FIG. 14 illustrates a perspective view of the quantum nanodot camera sensor 1400 having a color filter array 1410 disposed on top of the substrate 1420. As shown in FIG. 14, the substrate 1420 is subdivided into a plurality of pixel sensors 1430 each pixel sensor 1430 including a photo sensor 1432.

Figure 15:
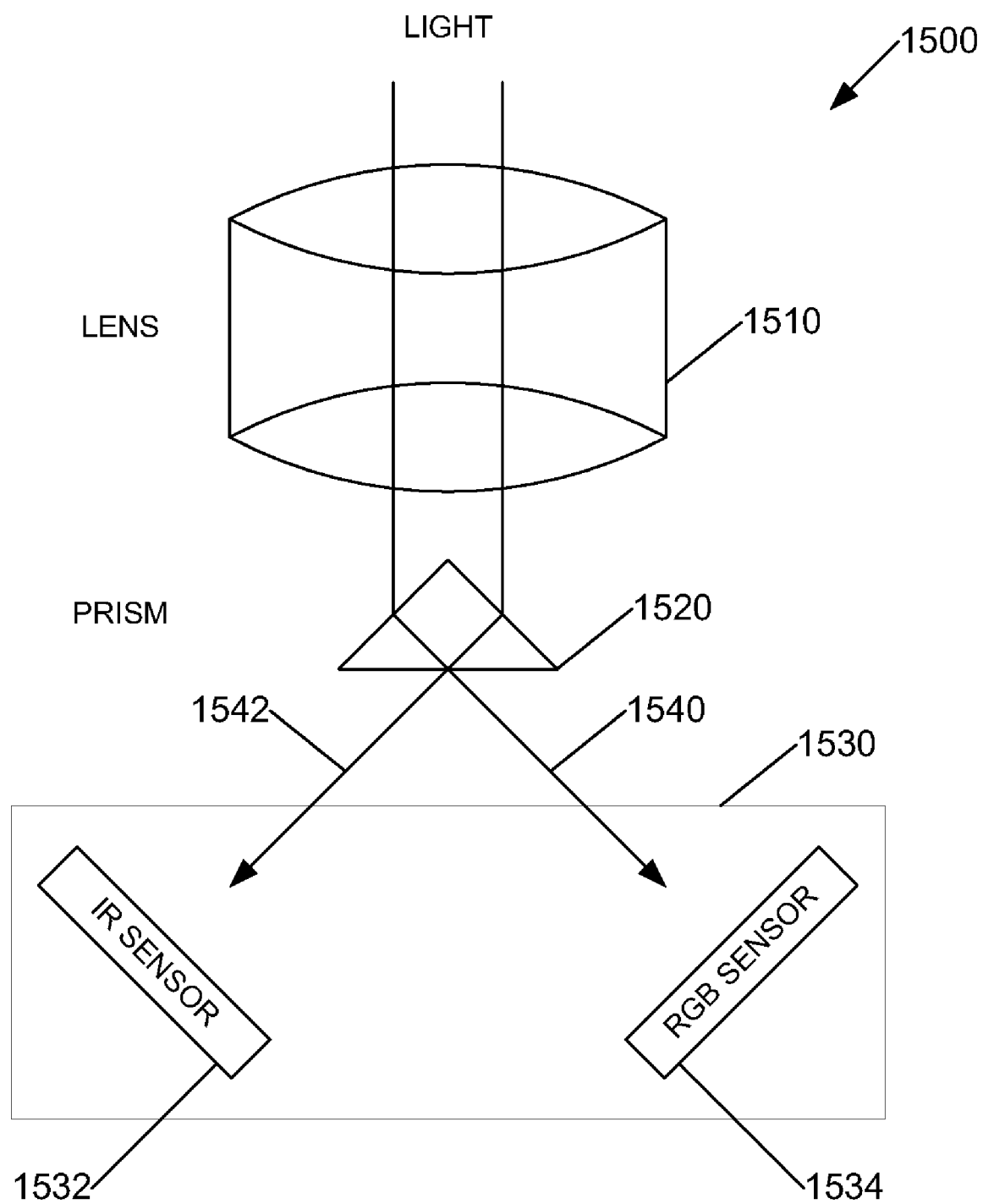
FIG. 15 shows an alternative implementation of the quantum nanodot camera.

FIG. 15 shows an alternative implementation of the quantum nanodot camera 1500 including a camera lens 1510, a prism 1520, and a single unit sensor 1530. The camera lens 1510 directs the light onto a prism 1520 configured to split the light into a visible component 1540 and an IR component 1542. The visible component 1540 is directed to an RGB sensor portion 1534 of the sensor 1530, and the IR component 1542 is directed to an IR sensor portion 1532 of the sensor 1530. The prism 1520 can be replaced with any light splitting apparatus.

Figure 16:
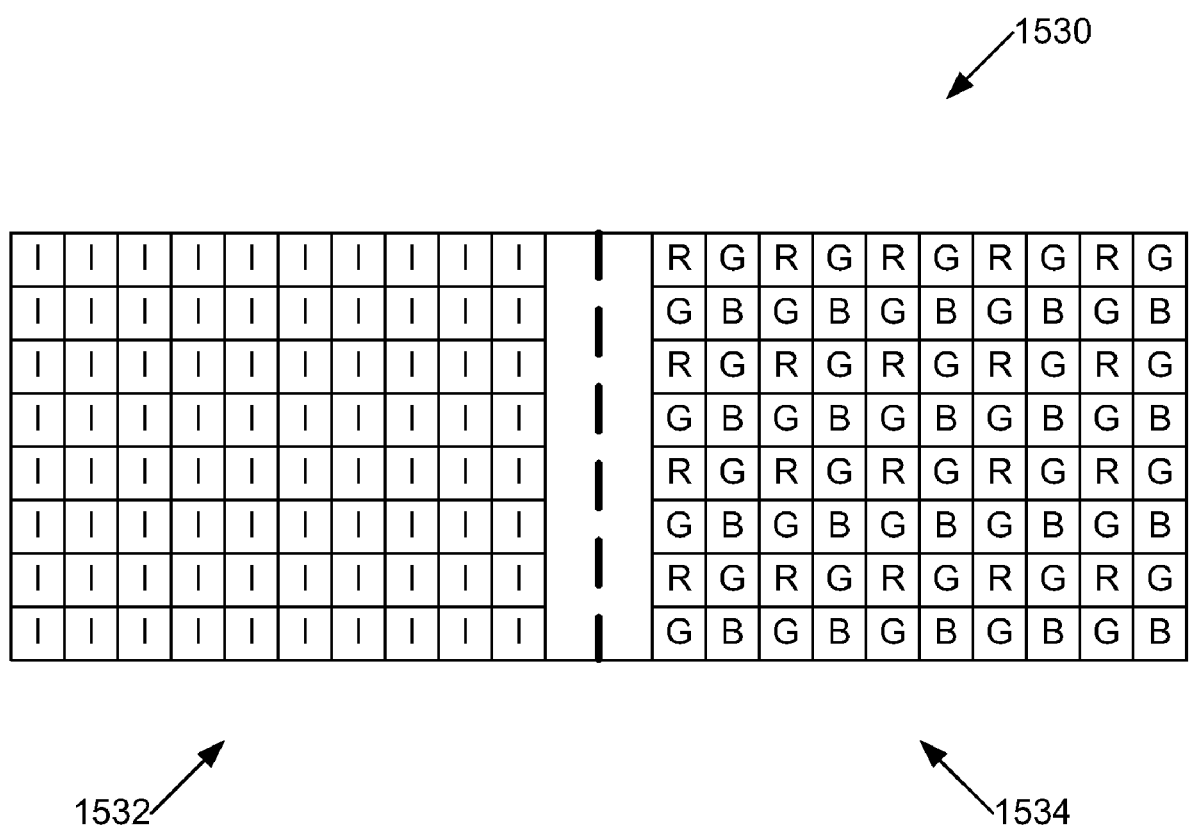
FIG. 16 illustrates one implementation of a quantum nanodot camera sensor including an RGB sensor portion and an IR sensor portion.

FIG. 16 illustrates one implementation of the sensor 1530 including the RGB sensor portion 1534 and the IR sensor portion 1532. In the illustrated implementation of FIG. 16, the IR sensor portion 1532 is configured with each pixel having an IR filter. The RGB sensor portion 1534 is configured with a plurality of 2×2 array of color filters. Each 2×2 array includes the top row having R and G color filters, respectively, and the bottom row having G and B color filters, respectively. Thus, the blue and red components each include one filter while the green component could include two filters: one filter for low green wavelength and another for high green wavelength.

In some implementations, the IR sensor portion 1532 can be configured differently than the RGB sensor portion 1534. For example, the IR sensor portion 1532 is configured as a CCD while the RGB sensor portion is configured as a CMOS.

It will be appreciated that the various illustrative logical blocks, modules, and methods described in connection with the above described figures and the implementations disclosed herein have been described above generally in terms of their functionality. In addition, the grouping of functions within a module is for ease of description. Specific functions or steps can be moved from one module to another without departing from the invention.

The above descriptions of the disclosed implementations are provided to enable any person skilled in the art to make or use the invention. Various modifications to these implementations will be readily apparent to those skilled in the art, and the generic principles described herein can be applied to other implementations without departing from the spirit or scope of the invention. Thus, it will be understood that the description and drawings presented herein represent implementations of the invention and are therefore representative of the subject matter which is broadly contemplated by the present invention. It will be further understood that the scope of the present invention fully encompasses other implementations that may become obvious to those skilled in the art and that the scope of the present invention is accordingly limited by nothing other than the appended claims.

What is claimed is:

1. A method comprising:
    applying a plurality of quantum nanodot (QD) markers to actors and/or objects performing within a capture volume;
    capturing scenes within the capture volume including the actors and/or objects using at least one visible pixel sensor cell;
    capturing motions of the plurality of QD markers tuned to emit narrowband IR signals, each QD marker of the plurality of QD markers individually tuned to emit an IR signal whose frequency bandwidth does not substantially overlap frequency bandwidths of IR signals emitted by other QD markers of the plurality of QD markers, wherein said capturing motions is performed substantially simultaneously with said capturing scenes using at least one IR pixel sensor cell; and integrating the scenes captured with the at least one visible pixel sensor cell with the motions of the actors and/or objects captured with the at least one IR pixel sensor cell.

2. The method of claim 1, wherein said applying a plurality of QD markers comprises:

suspending QD markers in water-based ink; and applying water-based ink on the actors and/or objects.

3. The method of claim 1, wherein said applying a plurality of QD markers comprises:

suspending QD markers in paint; and applying paint on the actors and/or objects.

4. The method of claim 1, wherein individually tuning each QD marker enables the plurality of QD markers to stay substantially invisible to the at least one visible pixel sensor cell but allows the actors and/or objects to be marked so that the at least one IR pixel sensor cell identifies different actors and/or objects.

5. The method of claim 4, further comprising processing the integrated scenes and motions to replace and/or delete one or more of the actors and/or objects identified by the at least one IR pixel sensor cell.

6. The method of claim 5, wherein the integrated and processed scenes and motions form frames of a motion picture.

7. The method of claim 5, wherein the integrated and processed scenes and motions form frames of a video game.

8. The method of claim 7, wherein said processing is performed at a predetermined timing to generate the frames of marked scenes for a motion picture.

9. The method of claim 8, wherein the predetermined timing is 24 frames per second.

10. The method of claim 1, wherein each pixel sensor of the at least one IR pixel sensor includes an infra-red filter to pass the narrowband IR signals.

11. The method of claim 10, wherein the infra-red filter is configured with a center wavelength at around 850 nm and a bandwidth of approximately 10 nm.

12. A method comprising:

applying water-based ink or paint having quantum nanodot (QD) markers to actors and/or objects performing within a capture volume;

capturing the actors and/or objects in a scene using visible sensors, and motions of the QD markers in the water-based ink or paint using IR sensors, wherein each QD marker of the QD markers individually tuned to emit a narrowband IR signal whose frequency bandwidth does not substantially overlap frequency bandwidths of IR signals emitted by other QD markers of the QD markers so that each QD marker can identify and distinguish the actors and/or objects; and integrating the captured scenes and the motions into frames of a motion picture.

13. The method of claim 12, further comprising processing the frames to replace and/or delete one or more of the actors and/or objects identified and distinguished by the QD markers.

* * * * *